United States Patent
Low et al.

(10) Patent No.: US 6,603,200 B1
(45) Date of Patent: *Aug. 5, 2003

(54) INTEGRATED CIRCUIT PACKAGE

(75) Inventors: Qwai H. Low, Cupertino, CA (US);
Chok J. Chia, Cupertino, CA (US);
Seng-Sooi (Allen) Lim, San Jose, CA (US)

(73) Assignee: LSI Logic Corporation, Milpitas, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 919 days.

(21) Appl. No.: 08/928,826

(22) Filed: Sep. 12, 1997

(51) Int. Cl.[7] ............................................ H01L 23/053
(52) U.S. Cl. ....................................... 257/700; 257/691
(58) Field of Search ................................. 257/700, 691

(56) References Cited

U.S. PATENT DOCUMENTS

| | | | | |
|---|---|---|---|---|
| 4,891,687 A | * | 1/1990 | Mallik et al. ................ | 357/70 |
| 4,982,311 A | * | 1/1991 | Dehaine et al. ............. | 361/388 |
| 5,036,163 A | | 7/1991 | Spielberger et al. ....... | 174/52.4 |
| 5,763,947 A | | 6/1998 | Bartley ........................ | 257/701 |
| 5,841,191 A | * | 11/1998 | Chia et al. .................. | 257/691 |
| 5,864,470 A | * | 1/1999 | Shim et al. ................. | 361/777 |

* cited by examiner

Primary Examiner—Long Pham
Assistant Examiner—Douglas A. Wille

(57) ABSTRACT

An integrated circuit package includes a connector board and plural levels of individual conductors and conductive vias disposed through the connector board to form electrical connections between external connection pads on an undersurface of the connector board and finger connections on the upper surface of the connector board. An integrated circuit die is mounted in a central region of the connector board within confines of the individual conductors that are arranged about the die, and wire bond connections are formed between selected ones of the finger connections, the individual conductors, and the connection pads on the integrated circuit die to provide distributed connections for ground and power at one or more operating voltage levels on the individual conductors.

6 Claims, 2 Drawing Sheets

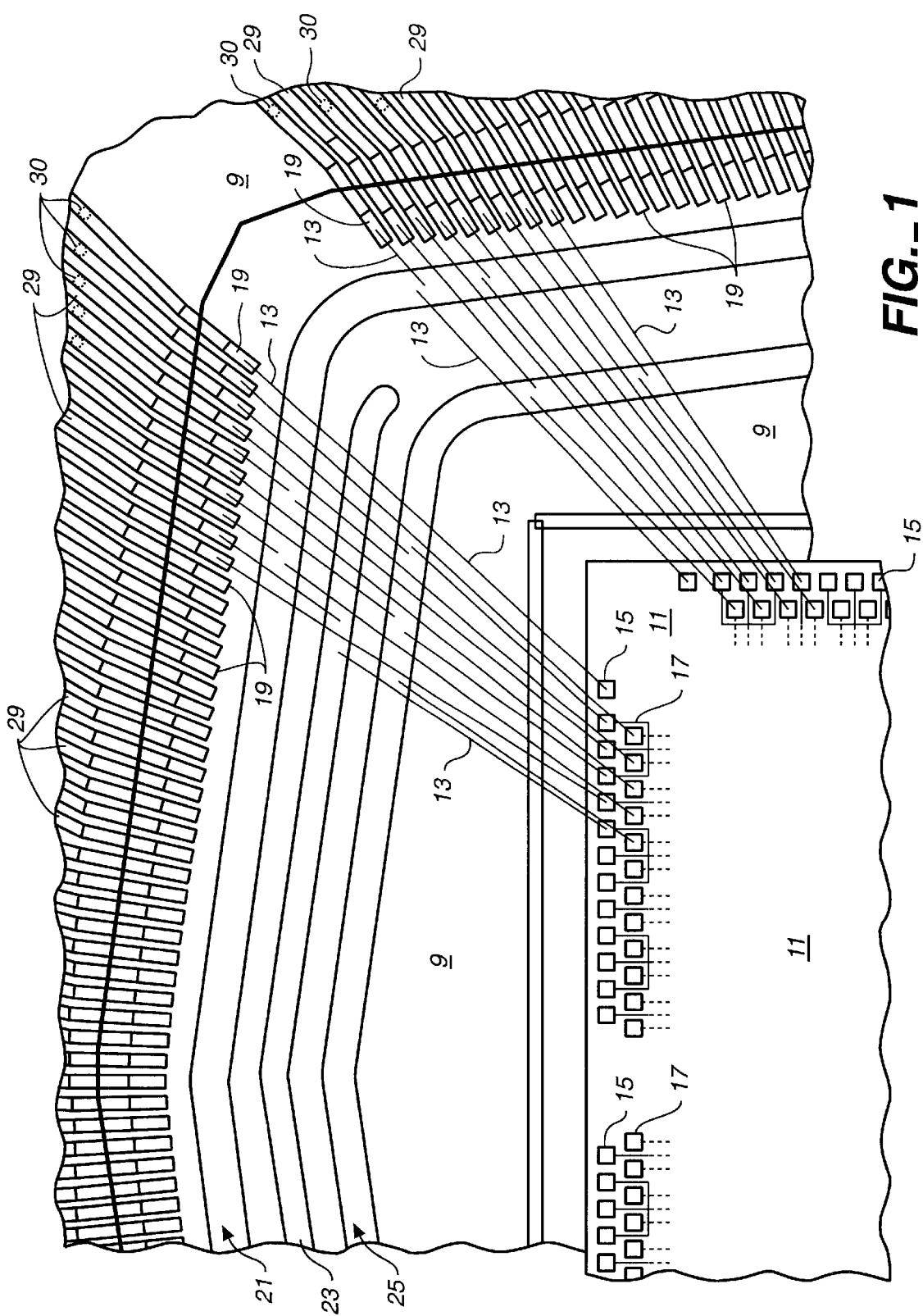
FIG._1

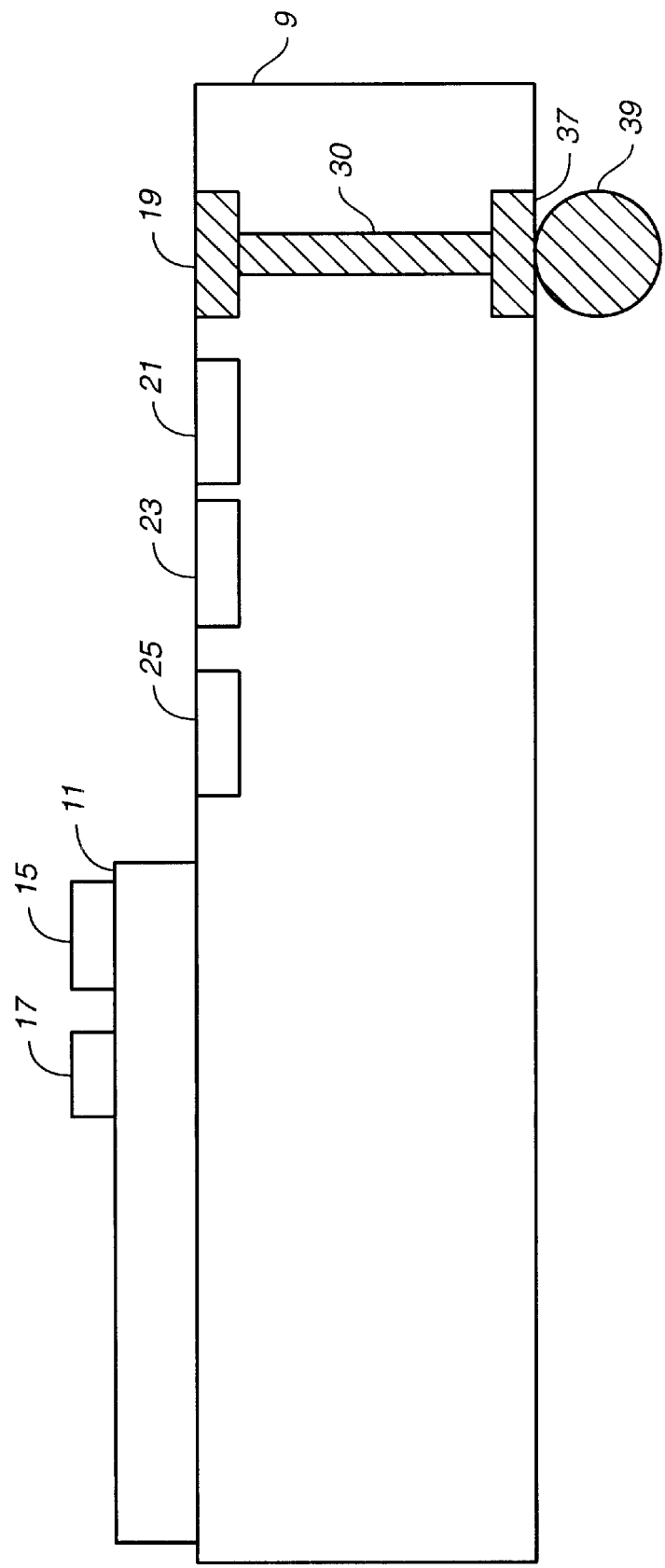
FIG._2

INTEGRATED CIRCUIT PACKAGE

FIELD OF THE INVENTION

This invention relates to integrated circuit packages, and more particularly to a versatile package to accommodate a family of different large-scale integrated circuits with small variations in connection patterns for different integrated circuits in the family.

BACKGROUND OF THE INVENTION

Large-scale integrated circuits are commonly mounted in central position on connector boards that include multiple connection pads or finger pads positioned about the periphery of the integrated circuits. Connection pads on the integrated circuit are then conventionally wire bonded or otherwise connected to the finger pads on the connector board that then expands out the area over which multiple connections to the assembly can be formed. Typical connector boards include multiple levels of interconnects between finger pads on one surface (that are wire bonded to connection pads on the integrated circuit), and solder pads on the opposite surface. Each particular configuration of integrated circuit commonly requires a particular configuration of connector board to complete the electrical conductivity from a connection pad on the integrated circuit to a corresponding solder pad on the underside of the connector board. Numerous different integrated circuit types require numerous different connector boards to assure that wire bond connections between connection pads or an integrated circuit and finger pads on the connector board generally correspond in physical arrays to avoid crossing and overlapping wire bonds therebetween by uninsulated wires. In addition, even families of similar integrated circuit types that are distinguished, for example, by processing speeds, or memory capacity, or the like, frequently differ in interconnect patterns only by additional ground ($V_{ss}$) connections and power ($V_{dd}$) connections in addition to signal connections into and out of the integrated circuit. These requirements promote high inventories of connector boards of dedicated designs that frequently differ only in power and ground connections.

Conventional connector boards have been developed which incorporate a ground ring on a connector board disposed about the perimeter of the integrated circuit die. This facilitates making ground connections to connection pads on the die at random locations around the ground ring that avoid overlapping or crossing bond wires. Similarly, power conductors have been positioned on connector boards typically at locations along the sides of the die intermediate the ground ring and finger pads on the connector board. In this way, power connections can be conveniently made via wire bonds between a connection pad on the die and random locations along the power conductors that avoid overlapping or crossing bond wires. However, such connector boards commonly incorporate specific interconnections between ground ring, power conductors, and the corresponding solder pads with concomitant dedication of the connector board to specific integrated circuit types.

SUMMARY OF THE INVENTION

In accordance with the present invention, a connector board of versatile design and layout permits wide variations in interconnect patterns to accommodate a wide variety of different types of integrated circuits mounted thereon. Specifically, undedicated vias or through-connections are provided between solder pads on an underside surface of a connector board and finger pads for wire bond connections to the integrated circuit die mounted on the upper side surface of the connector board. In addition, a plurality of unconnected ground and power conductors are successively spaced about and out from the central mounting region for an integrated circuit die on a connector board. Optional connections of these unconnected or electrically floating conductors to finger pads and associated vias can accommodate multiple patterns of different circuit connections and multiple different voltage supplies associated with different types of integrated circuits.

BRIEF DESCRIPTION OF THE DRAWINGS

FIG. 1 is a top view of a portion of an assembled connector board with attached integrated circuit die and wire bonded connections; and FIG. 2 is a partial, pictorial cross-sectional view of a connector board of FIG. 1.

DESCRIPTION OF THE INVENTION

Referring now to FIG. 1, there is shown a top view of a portion of an assembled connector board 9 with attached integrated circuit die 11 and wire bond connections 13 between individual connection pads 15, 17 arrayed on the die 11 in one or more peripheral rows, and the individual connection pads, or finger pads 19 on the connector board 9. Each finger pad 19 is connected via individual conductors 29 to sites on the upper side of the connector board at which vias or through-connections 30 pass from the upper surface to one or other intermediate or lower-most planes of conductors, as later described herein. The upper, lower, and intermediate planes of conductors are thereby electrically connected to solder pads on the lower-most plane that are arranged typically in orderly or regular patterns of 3–6 successively-spaced peripheral rows along each edge of the connector board 9.

In accordance with the present invention, a plural number of peripheral conductors 21, 23, 25 are disposed on the upper surface of the connector board 9 about the periphery of the die 11 and intermediate the boundary of the die and the locus of inner edges of the finger pads 19. These peripheral conductors are not connected anywhere or to any vias within the connector board 9, and may be considered as being unconnected, or electrically 'floating'. Preferably, the innermost peripheral conductor 25 may be selected to serve as a ground connection, and one or more additional peripheral conductors 21, 23 may be selected to provide electrical power, for example, at different voltage levels of 2.5 and 3.3 volts, or the like. In this way power ($V_{dd}$) and ground ($V_{ss}$) connections may be made to selected connection pads 15, 17 on the die 9 from the peripheral conductors at random locations thereon that avoid crossings or overlaps of the uninsulated bond wires 13. In addition, one or more of the finger pads 19 on the connector board 9 may be connected to selected ones of the peripheral conductors 21, 23, 25 at random locations thereon that avoid crossings or overlaps of the uninsulated bond wires 13. Also, it is possible to connect a peripheral conductor 21, 23, 25 at several locations thereon to individual finger pads 19 on the connector board 9 in order to reduce the current density in any one circuit of bond wire 13, finger pad 19, conductor 29, via 30, and solder pad. Also, multiple peripheral conductors 21, 23 thus connected to separate electrical supplies permit greater versatility of integrated circuit designs for assembly on a connector board 9 of common design that conveniently accommodates multiple types of integrated circuits 11. Numerous other bond wires 13 may connect directly between selected connection pads 15, 17 on the die 11 and finger pads 19 on the connector board 9 to transfer signals or to supply individual power or ground connections.

FIG. 2 is a cross section view of the package illustrated in FIG. 1. As shown in FIG. 2, each of a plurality of vias 30 connects a respective one of the finger pads 19 with one of the solder pads 37 (only one of which is shown for clarity) located along the bottom of the package. Each of the solder pads 37 are electrically connected to one of a plurality of solder balls 39 (only one of which is shown for clarity). The associated vias 30 form connections between upper-layer conductors and intermediate-layer or lower-layer conductors 35 with solder pads 37 connected thereto, and between lower layer conductors 35 and intermediate layer conductors 31, 33. In this way, upper layer conductors such as ground and power conductors 25, 23, 21, and finger pads 19 with individual conductors 29 connected thereto may be selectively connected to solder pads 37 through vias 30 and intermediate layers 31, 33 in a manner that is specific to the particular connector board 9. Bond wires may then be connected at assembly time to selected upper layer conductors and to connection pads 15, 17 on the die 11 in various patterns that promote the versatility of one specific connector board 9 being capable of establishing connections to many different types of integrated circuit chips 11. Solder balls 39 disposed on solder pads 37 then facilitate electrical and physical connections to external circuitry using conventional reflow soldering techniques.

Therefore, the connector board assembly according to the present invention provides selectable connections to floating power and ground conductors at time of assembly for more versatile application of fewer specific connector boards to form electrical connections to numerous different types of integrated circuit chips.

What is claimed is:

1. A method for manufacturing an integrated circuit apparatus for electrically connecting a plural number of connection pads on an integrated circuit die to external connection pads, the method comprising the steps of:

mounting an integrated circuit die on a connector board, the connector board including:

a central region on a first surface thereof and a plural number of external connection pads disposed in a selected pattern on an opposite surface of the connector board;

a plurality of individual conductive finger connections disposed on the first surface of the connector board in laterally-spaced array about the central region for forming wire connections thereon;

a plural number of conductive vias disposed in electrical contact with the external connection pads and traversing the spacing between said first and said opposite surfaces of the connector board and being electrically connected to selected ones of the finger connections for providing electrical continuity between selected finger connections and selected external connection pads;

a first conductor on the first side of the connector board, the first conductor not being electrically connected to any of the conductive vias;

after the step of mounting the integrated circuit die on the connector board, connecting a first one of the finger connections to the first conductor, thereby electrically connecting the first conductor with one of the conductive vias that is connected to the first one of the finger connections, thereby establishing whether the first conductor will be a power conductor or a ground conductor; and after the step of mounting the integrated circuit die on the connector board, connecting at least two bond pads on the integrated circuit with the first conductor.

2. The method of claim 1 wherein the first conductor is intermediate the central region and the conductive finger connections.

3. The method of claim 1 wherein the first conductor comprises a ring.

4. The method of claim 1 wherein the step of connecting the first one of the finger connections to the first conductor is performed by wire bonding.

5. The method of claim 1 wherein the step of connecting at least two bond pads on the integrated circuit with the first conductor is performed by wire bonding.

6. The method of claim 1 wherein the connector board includes a second conductor that is not electrically connected to any of the conductive vias when the step of mounting the integrated circuit die is performed, and wherein the method further comprises the steps of:

after the step of mounting the integrated circuit die on the connector board, connecting a second one of the finger connections to the second conductor, thereby electrically connecting the second conductor with one of the conductive vias that is connected to the second one of the finger connections, thereby establishing whether the second conductor will be a power conductor or a ground conductor; and after the step of mounting the integrated circuit die on the connector board, connecting at least two bond pads on the integrated circuit with the second conductor.

* * * * *